(12) United States Patent
Nishino

(10) Patent No.: US 11,505,142 B2
(45) Date of Patent: *Nov. 22, 2022

(54) POWER DISTRIBUTION DEVICE

(71) Applicant: TOYOTA JIDOSHA KABUSHIKI KAISHA, Toyota (JP)

(72) Inventor: Yoshio Nishino, Ichinomiya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/484,182

(22) Filed: Sep. 24, 2021

(65) Prior Publication Data
US 2022/0009432 A1    Jan. 13, 2022

Related U.S. Application Data

(63) Continuation of application No. 16/878,712, filed on May 20, 2020, now Pat. No. 11,155,222.

(30) Foreign Application Priority Data

Aug. 5, 2019  (JP) .............................. JP2019-143825

(51) Int. Cl.
*H03K 17/687* (2006.01)
*B60R 16/03* (2006.01)
*B60R 16/00* (2006.01)

(52) U.S. Cl.
CPC ............ *B60R 16/03* (2013.01); *B60R 16/005* (2013.01); *H03K 17/6871* (2013.01)

(58) Field of Classification Search
None
See application file for complete search history.

(56) References Cited

U.S. PATENT DOCUMENTS

2017/0008466 A1   1/2017   Kikuchi
2020/0016981 A1   1/2020   Kageyama et al.

FOREIGN PATENT DOCUMENTS

JP    2017-019328 A    1/2017

OTHER PUBLICATIONS

Jun. 25, 2021 Notice of Allowance issued in U.S. Appl. No. 16/878,712.

*Primary Examiner* — Cassandra F Cox
(74) *Attorney, Agent, or Firm* — Oliff PLC

(57) ABSTRACT

A power distribution device includes a first switch configured to connect a power supply source or a first device to a second device, a second switch configured to connect the second device and a third device distributing predetermined power, and a control unit configured to control conduction and cutoff of the first and the second switches based on an output voltage of the power distribution device. The control unit switches the first switch to a conductive state and the second switch to a cutoff state when an input voltage of the second device does not drop to a predetermined control start voltage, and switches, when the input voltage of the second device temporarily drops to the control start voltage, the first switch to the cutoff state and the second switch to the conductive state, and supplies the power from the third device to the second device.

8 Claims, 8 Drawing Sheets

POWER DISTRIBUTION DEVICE

CROSS-REFERENCE TO RELATED APPLICATION

This application is a continuation of U.S. application Ser. No. 16/878,712 filed May 20, 2020, which is based on and claims priority under 35 U.S.C. 119 from Japanese Patent Application No. 2019-143825 filed on Aug. 5, 2019, incorporated herein by reference in its entirety.

BACKGROUND

1. Technical Field

The disclosure relates to a power distribution device that distributes power of a power supply source to a plurality of devices.

2. Description of Related Art

In a vehicle, it is necessary to appropriately supply power from a power supply source, such as a generator and a battery, to a plurality of in-vehicle devices. In general, power is supplied by connecting the power supply source and each of the in-vehicle devices using a wire harness, which is an assembly of a large number of electric wires. However, in recent years, the number of in-vehicle devices has been increasing, and thus wiring structures of power supply lines and communication lines in a vehicle are too complicated.

To address this problem, JP-A-2017-019328 proposes a power distribution structure in which a power supply of a vehicle is constructed as a main line routed inside the vehicle, power supply boxes are provided at various points on the main line, and each in-vehicle device is supplied power from the nearest power supply box.

SUMMARY

However, according to the disclosure described in JP-A-2017-019328, since a plurality of power supply boxes are connected in a tree structure, when the output voltage of the upstream power supply box is unstable due to, for example, temporary large current consumption, power supply to the downstream power supply box connected to the power supply box will be affected.

The present disclosure is intended to address such a shortcoming, of which an objective is to provide a power distribution device which can reduce influence on the power supplied to a power supply box connected at a downstream side even when an output voltage of an upstream power supply box is unstable.

In order to address the shortcoming stated above, one aspect of the present disclosure is to provide a power distribution device that is directly connected to a power supply source mounted on a vehicle or indirectly connected to the power supply source via a first device, and distributes power of the power supply source to a second device. The power distribution device includes: a first switch configured to connect the power supply source or the first device to the second device; a second switch configured to connect the second device and a third device capable of distributing predetermined power; and a control unit configured to control conduction and cutoff of the first switch and the second switch based on an output voltage of the power distribution device. The control unit is configured to: switch the first switch to a conductive state and the second switch to a cutoff state if an input voltage of the second device does not drop to a predetermined control start voltage; and switch, when the input voltage of the second device temporarily drops to the control start voltage, the first switch to the cutoff state and second switch to the conductive state, and control the third device such that the third device supplies power to the second device.

With the power distribution device according to the present disclosure, when the output voltage to a downstream device (second device) to which the power of the power supply source is supplied is unstable, the influence on the power supply to the downstream device can be reduced.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

The power distribution device of the present disclosure stops the power supply from the original power distribution device to a downstream device when an output voltage for the downstream device to which the power is supplied is unstable. The downstream device is connected to another power distribution device and is supplied power from the other power distribution device. Consequently, the influence on the power supply to the downstream device can be reduced.

Hereinafter, the power distribution device according to embodiments of the present disclosure will be described in detail with reference to the drawings.

First Embodiment

Configuration

Figure 1:
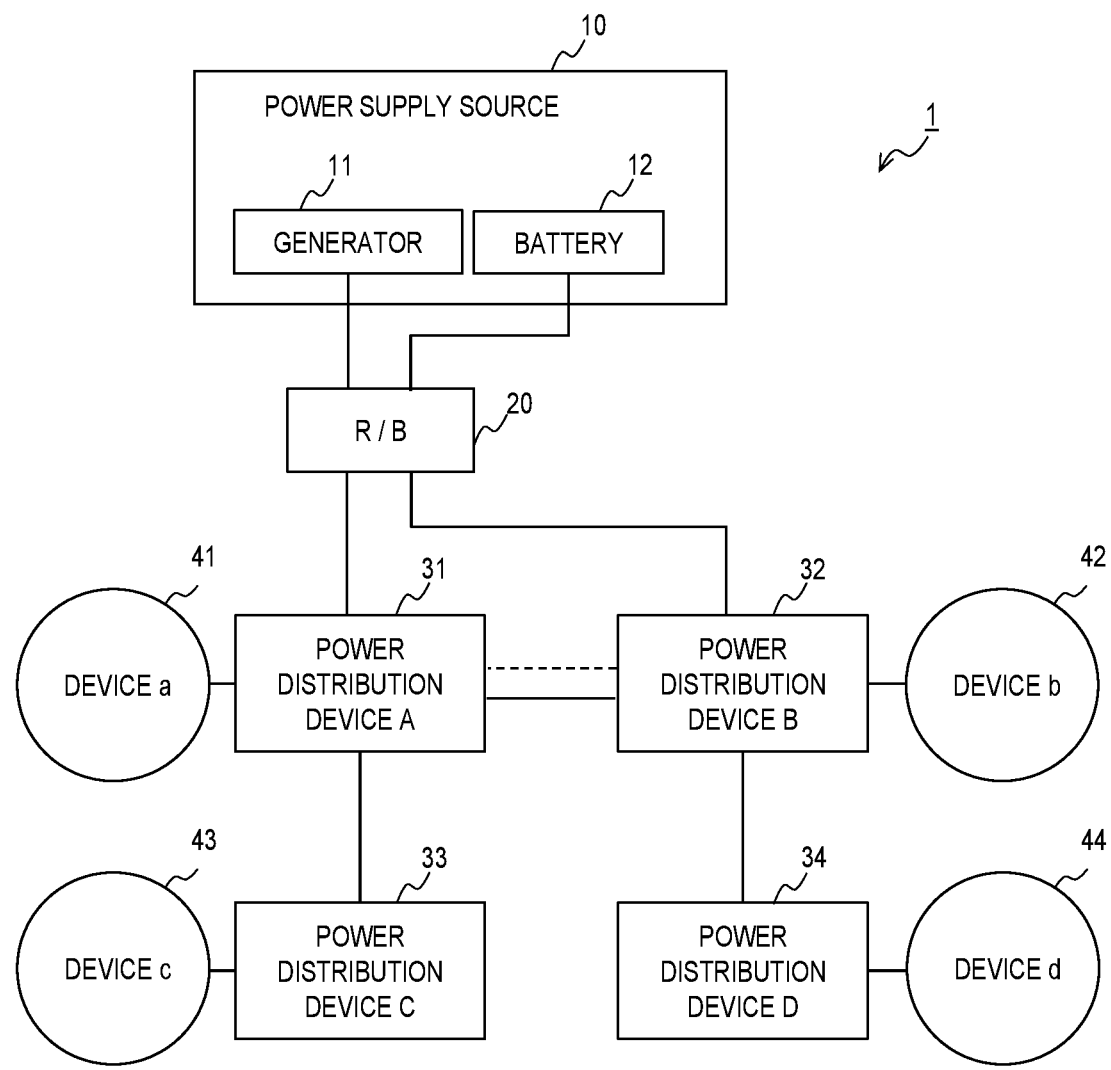
FIG. 1 is a schematic configuration diagram of a power supply system including a power distribution device according to a first embodiment.

FIG. 1 is a diagram illustrating a schematic configuration example of a power supply system including a power distribution device according to a first embodiment of the present disclosure. A power supply system 1 according to the present embodiment illustrated in FIG. 1 includes a power supply source 10, a relay box (R/B) 20, and a plurality of power distribution devices 31, 32, 33 and 34. The power supply system 1 may be mounted on, for example, a vehicle, and is configured to be able to supply power of the power supply source 10 to a plurality of in-vehicle devices 41, 42, 43, and 44 which are electric loads.

The power supply source 10 is a power supply device capable of supplying power, and examples thereof include a generator 11 such as an alternator, and a battery 12 that is a power storage element such as an auxiliary battery. Further, the power supply source 10 may include a DC-DC converter that converts power of a driving battery into power of a predetermined voltage, and outputs the power.

A relay box 20 is an embodiment of a power supply box that can distribute power supplied from the power supply source 10 to a predetermined number of loads. The relay box 20 of the present embodiment divides the power supplied from the power supply source 10 into two, and outputs a first portion of power to a power distribution device A_31, and a second portion of power to a power distribution device B_32. The power supply source 10 may be directly connected to the power distribution device A_31 and the power distribution device B_32 without using the relay box 20.

The power distribution device A_31 is the power distribution device according to the first embodiment, and one aspect of the power supply box capable of distributing the first portion of power output from the relay box 20 for a plurality of loads, and of switching a power distribution destination in accordance with a current consumption status of an in-vehicle device a_41. The power distribution device A_31 includes a switch SW1, a switch SW2, and a control unit C1 as illustrated in the detailed view of FIG. 2.

The switch SW1 is inserted between an input terminal to which the relay box 20 is connected and an output terminal to which a power distribution device C_33 is connected. The switch SW2 is inserted between the output terminal and a switch SW3 (described later) of the power distribution device B_32. The in-vehicle device a_41 is connected to a path connecting the input terminal and the switch SW1. The control unit C1 can detect an input current I1 flowing into the input terminal, an output current I2 flowing out of the output terminal, an input voltage V1 at the input terminal, and an output voltage V2 at the output terminal, respectively. Then, the control unit C1 controls conduction and cutoff of the switches SW1 and SW2 based on the input current I1, the output current I2, the input voltage V1, and the output voltage V2, which have been detected. Further, the control unit C1 is communicably connected to a control unit C2 (described later) of the power distribution device B_32.

Figure 2:
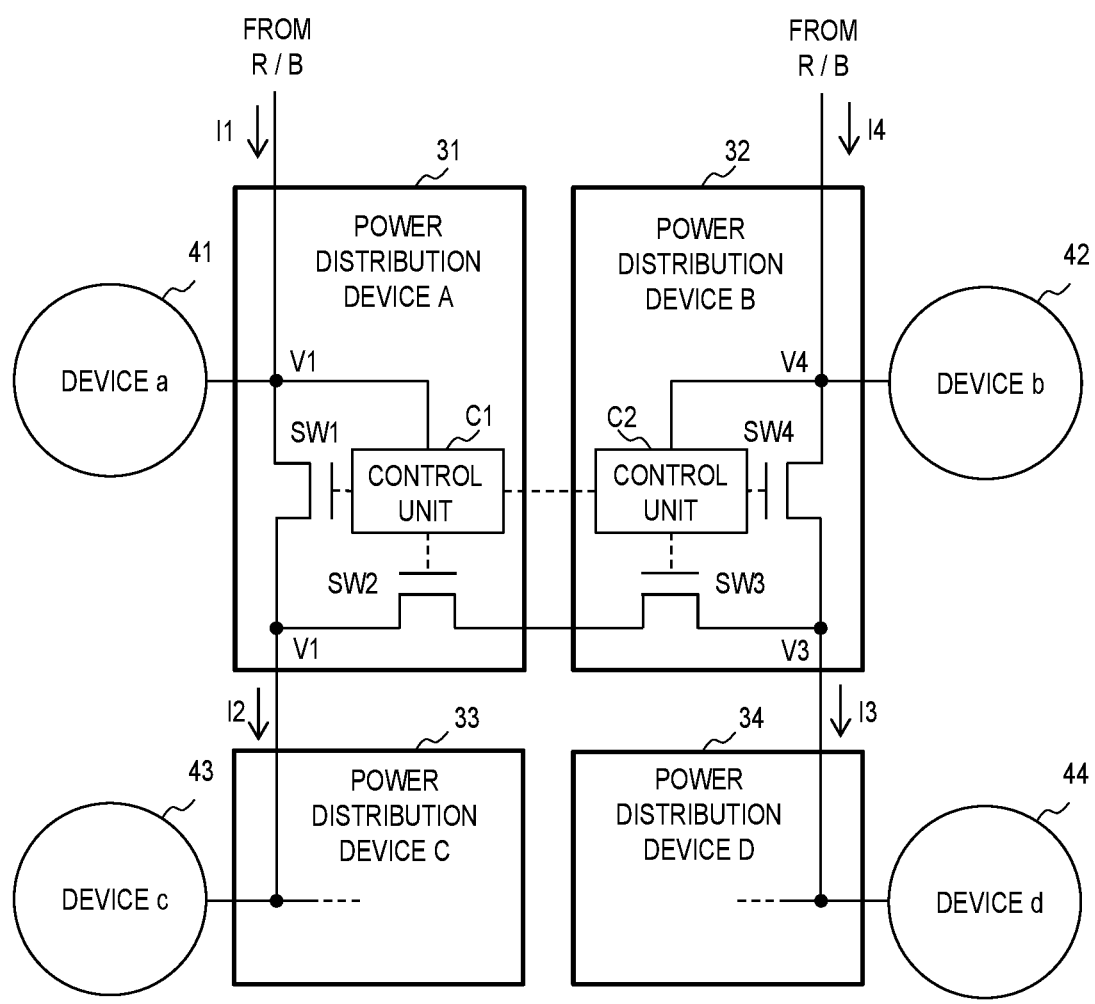
FIG. 2 is a detailed view of the power distribution device according to the first embodiment.

In the example of FIG. 2, the power distribution device A_31 distributes the first portion of power output from the relay box 20 for a plurality of loads, supplies a portion of the first portion of power to the in-vehicle device a_41, and supplies a portion of the first portion of power to the control unit C1. Then, in a case where the switch SW1 is in a conductive state by the control of the control unit C1, the remaining power is output to the power distribution device C_33 via the switch SW1. The control of the control unit C1 will be described later.

The power distribution device B_32 is the power distribution device according to the first embodiment, and one aspect of the power supply box capable of distributing the second portion of power output from the relay box 20 for a plurality of loads, and of switching a power distribution destination in accordance with a current consumption status of an in-vehicle device b_42. The power distribution device B_32 includes a switch SW3, a switch SW4, and a control unit C2 as illustrated in the detailed diagram of FIG. 2, and has a symmetric configuration with that of the power distribution device A_31.

The switch SW4 is inserted between the input terminal to which the relay box 20 is connected and the output terminal to which a power distribution device D_34 is connected. The switch SW3 is inserted between the output terminal and the switch SW2 of the power distribution device A_31. The in-vehicle device b_42 is connected to a path connecting the input terminal and the switch SW4. The control unit C2 can detect an input current I4 flowing into the input terminal, an output current I3 flowing out of the output terminal, an input voltage V4 at the input terminal, and an output voltage V3 at the output terminal, respectively. Then, the control unit C2 controls conduction and cutoff of the switches SW4 and SW3 based on the input current I4, the output current I3, the input voltage V4, and the output voltage V3, which have been detected. Further, the control unit C2 is communicably connected to the control unit C1 of the power distribution device A_31.

In the example of FIG. 2, the power distribution device B_32 distributes the second portion of power output from the relay box 20 for a plurality of loads, supplies a portion of the second portion of power to the in-vehicle device b_42, and supplies a portion of the second portion of power to the control unit C2. Then, in a case where the switch SW4 is in a conductive state by the control of the control unit C2, the remaining power is output to the power distribution device D_34 via the switch SW4. Since the control of the control unit C2 is the same as that of the control unit C1, description will be omitted except for the description of the control unit C1.

The power distribution device C_33 is one aspect of the power supply box, and can distribute the power output from the power distribution device A_31 for a plurality of loads, and supply one component of the power to an in-vehicle device c_43 as a power source, as illustrated in the detailed view of FIG. 2.

The power distribution device D_34 is one aspect of the power supply box, and can distribute the power output from the power distribution device B_32 for a plurality of loads, and supply one component of the power to an in-vehicle device d_44 as a power source, as illustrated in the detailed view of FIG. 2.

Although FIGS. 1 and 2 show an example in which four power distribution devices 31, 32, 33, and 34 are connected in a π-type tree structure, the number of, and connection structure of, the power distribution devices are not limited thereto. Basically, the power distribution device, to which a power distribution device to be supplied power is connected at a downstream side, has a configuration which is the same as that of the power distribution device A_31 or the power distribution device B_32. A power distribution device at the end of the π-type tree structure, to which no power distribution device to be supplied power is connected at the downstream side, has a configuration which is the same as that of the power distribution device C_33 or the power distribution device D_34. Further, the in-vehicle devices 41, 42, 43, and 44 connected to the power distribution devices 31, 32, 33, and 34 are not limited to the devices shown in FIGS. 1 and 2. Further, the switches SW1, SW2, SW3, and SW4 are exemplified by switches using semiconductor elements, but may be switches of mechanical relays. Further, the control units C1 and C2 may be configured as electronic control units (ECU) respectively including a processor, a memory, and an input/output interface. Further, a flat wiring member (bus bar) through which a large current can flow can be used for power lines connecting the power distribution devices.

Control

Figure 3:
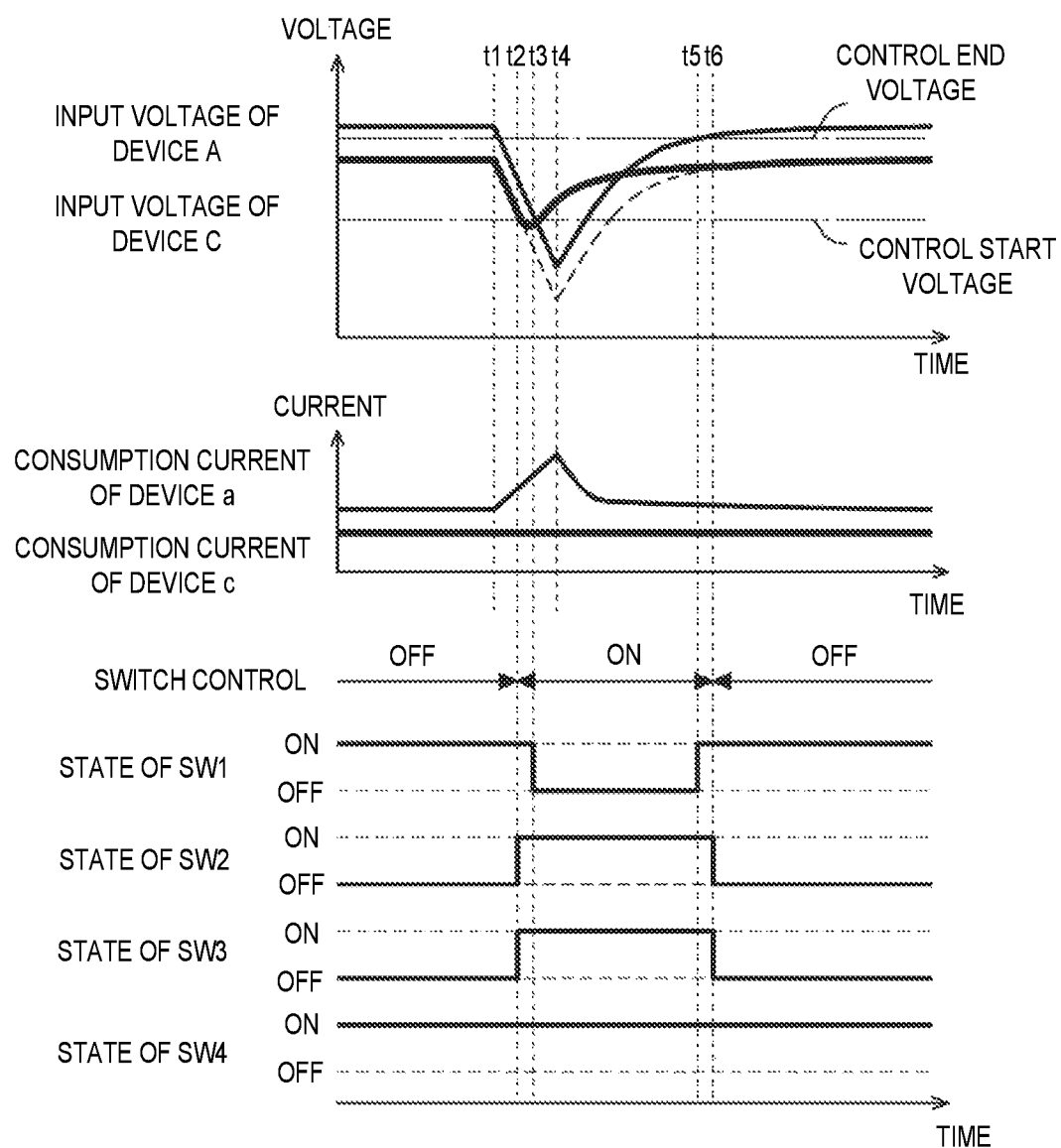
FIG. 3 is an exemplified timing chart of switching control executed by the power distribution device according to the first embodiment.
Figure 4A:
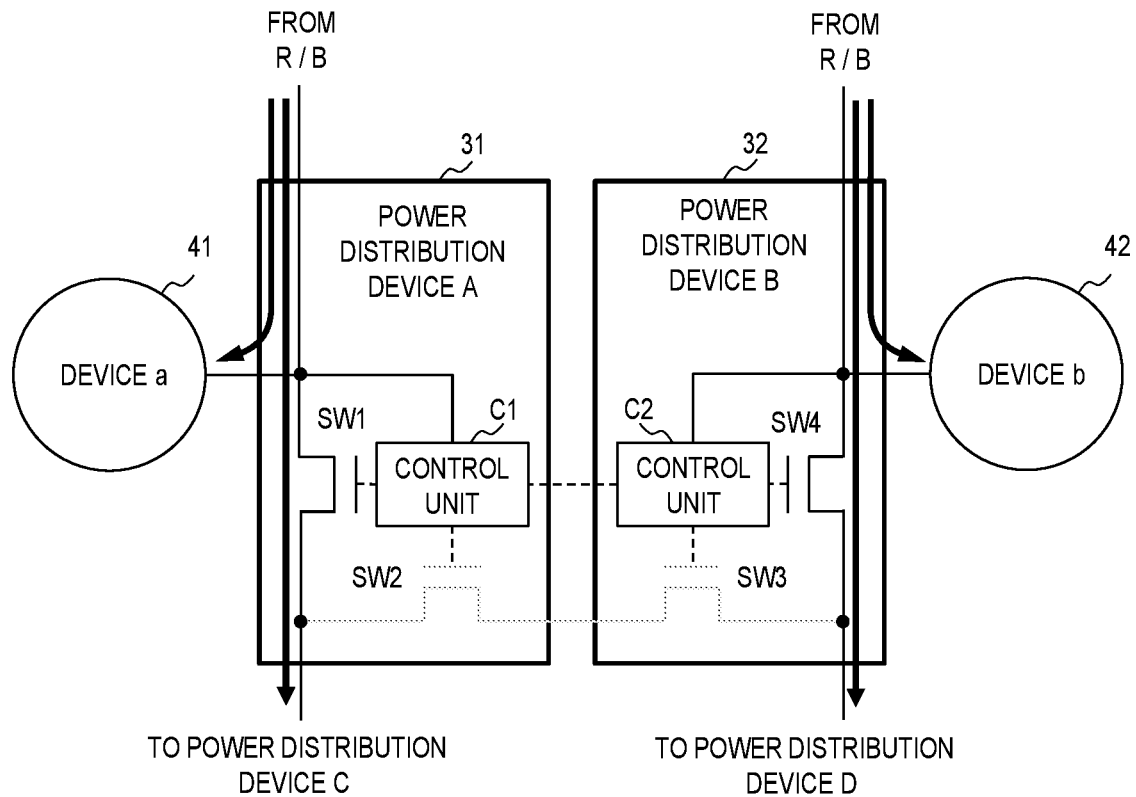
FIG. 4A is a diagram illustrating a power supply path when each switch is switched to a first state.
Figure 4B:
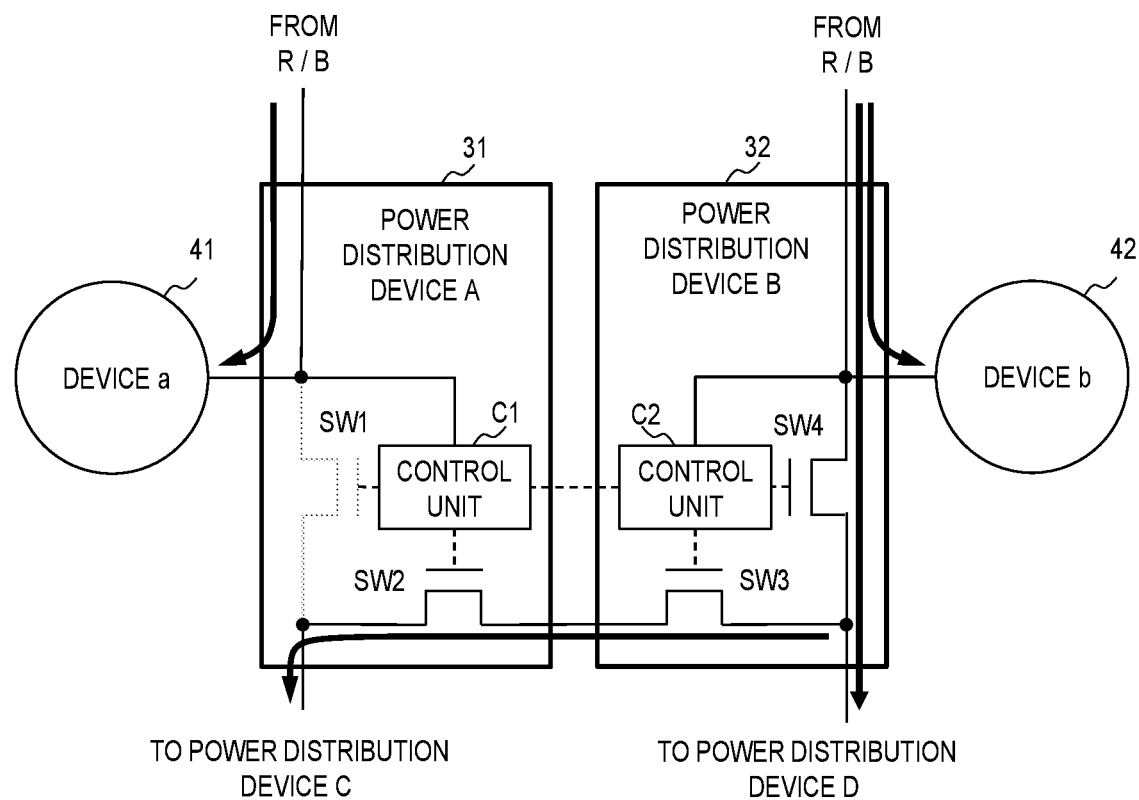
FIG. 4B is a diagram illustrating a power supply path when each switch is switched to a second state.

Next, the control executed by the power distribution device according to the first embodiment of the present disclosure will be described with reference to FIGS. 3, 4A, and 4B. FIG. 3 is a timing chart illustrating switching control executed by the power distribution devices A_31 and B_32 in a case where large current consumption occurs in the in-vehicle device a_41, as an example. In this example, it is assumed that a consumption current of the in-vehicle device c_43 is constant during a switching period, and that the power distribution device B_32 has enough power to sufficiently supply the consumption current of the in-vehicle device c_43.

In a case where time<t1, the current consumption of each in-vehicle device falls within a predetermined range, and conduction (ON) and cutoff (OFF) states of each switch correspond to a first state in which normal power supply is performed (SW1: ON, SW2: OFF, SW3: OFF, and SW4: ON). FIG. 4A illustrates a power supply path in the first state. In FIG. 3, the input voltage of the power distribution device C_33 falls below the input voltage V1 of the power distribution device A_31 by a voltage drop obtained from the output current I2 of the power distribution device A_31 and a resistance (wiring resistance R) of the wire harness connecting the power distribution device A_31 and the power distribution device C_33 (the voltage drop at the switch SW1 is negligible).

In a case were t1≤time<t2, the input voltage V1 (=output voltage V2) of the power distribution device A_31 gradually decreases in accordance with the large current consumption occurring in the in-vehicle device a_41, and accordingly, the input voltage of the power distribution device C_33 also gradually decreases. The input voltage V1 decreases based on the wiring resistance of the wire harness connecting the relay box 20 and the power distribution device A_31 and the consumption current of the in-vehicle device a_41.

In a case where time=t2, since the input voltage of the power distribution device C_33 decreases to a control start voltage, the control unit C1 of the power distribution device A_31 executes the switching. At the time t2, the switch SW2 and the switch SW3 are first turned on (SW1: ON, SW2: ON, SW3: ON and SW4: ON) so that the power supply to the power distribution device C_33 does not stop when the switches are switched. Accordingly, the power can be supplied to the power distribution device C_33 from either the power distribution device A_31 or the power distribution device B_32. The control unit C1 estimates that the input voltage of the power distribution device C_33 decreases to the control start voltage from the output current I2, the output voltage V2, and the wiring resistance R. The control start voltage is set to be equal to or higher than the minimum voltage required for stably operating the in-vehicle device c_43.

In a case where time=t3, the control unit C1 of the power distribution device A_31 cuts off the switch SW1 to set the switch SW1 to the second state after a predetermined time has elapsed (SW1: OFF, SW2: ON, SW3: ON and SW4: ON). FIG. 4B illustrates a power supply path in the second state. Consequently, the input terminal and the output terminal of the power distribution device A_31 are disconnected, and the output voltage V2 is not influenced by the large current consumption in the in-vehicle device a_41. The output voltage V3 of the power distribution device B_32 is applied to the output voltage V2 of the power distribution device A_31 via the switches SW2 and SW3.

In a case where t3<time<t4, since the large current consumption in the in-vehicle device a_41 continues, the input voltage V1 of the power distribution device A_31 continues to decrease. On the other hand, the input voltage of the power distribution device C_33 (that is, the output voltage V2 of the power distribution device A_31) gradually increases while being influenced by the current consumption in the in-vehicle devices b_42 and d_44. For comparison, the input voltage of the power distribution device C_33 when the switching control is not performed is indicated by a dashed line in FIG. 3.

In a case where t4≤time<t5, the large current consumption in the in-vehicle device a_41 is ceased, and the input voltage V1 of the power distribution device A_31 starts to increase. The input voltage of the power distribution device C_33 (that is, the output voltage V2 of the power distribution device A_31) also gradually increases based on the current consumption of the in-vehicle devices b_42 and d_44.

In a case where time=t5, since the input voltage V1 of the power distribution device A_31 has increased to the control end voltage, the control unit C1 of the power distribution device A_31 cancels the switching, i.e. returns the second state to the first state. The switch SW1 is first turned on (SW1: ON, SW2: ON, SW3: ON and SW4: ON) so that the power supply to the power distribution device C_33 does not stop even when the switching is canceled. Accordingly, the input terminal and the output terminal of the power distribution device A_31 are connected, and then power can be supplied to the power distribution device C_33 from either the power distribution device A_31 or the power distribution device B_32. Further, the control end voltage is set to a voltage at which the input voltage of the power distribution device C_33 does not immediately drop to the control start voltage due to the consumption current of the in-vehicle device c_43 when returning to the first state.

In a case where time=t6, the control unit C1 of the power distribution device A_31 cuts off the switches SW2 and the SW3 to set them to the first state after a predetermined time has elapsed (SW1: ON, SW2: OFF, SW3: OFF and SW4: ON). Consequently, the power distribution device B_32 is disconnected from the power distribution device A_31, and power is supplied from only the power distribution device A_31 to the power distribution device C_33 (see FIG. 4A).

Action & Effect

As stated above, according to the power distribution device of the first embodiment, the power distribution device of the present disclosure stops the power supply from the power distribution device to a downstream device when an output voltage for the downstream device to which the power is supplied is unstable due to temporary large current consumption of the in-vehicle devices connected thereto. The downstream device is connected to the other power distribution device and is supplied power from the original other power distribution device. Consequently, the influence on the power supply to the downstream device can be reduced in a case where the output voltage to the downstream device is unstable.

Further, according to the power distribution device of the first embodiment, the power distribution device cuts off the path for supplying power from the other power distribution device to the downstream device when the output voltage for the downstream device to which the power is supplied is no longer unstable, and when the path for supplying the power from the original power distribution device to the downstream device becomes conductive. Accordingly, the power supply system can be returned to the normal power supply state.

Second Embodiment

Configuration

Figure 5:
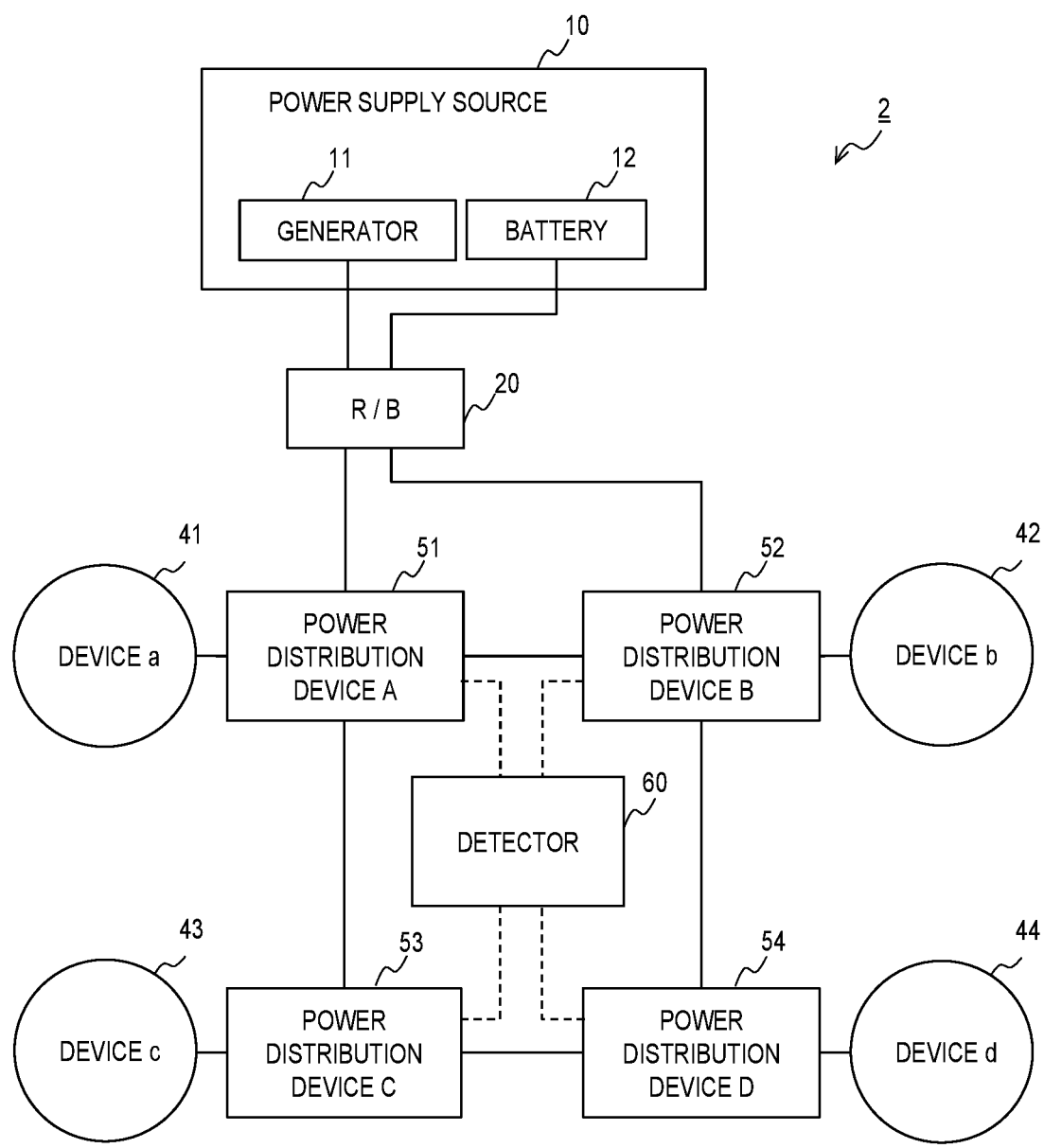
FIG. 5 is a schematic configuration diagram of a power supply system including a power distribution device according to a second embodiment.

FIG. 5 is a diagram illustrating a schematic configuration example of a power supply system including a power distribution device according to a second embodiment of the present disclosure. A power supply system 2 according to the present embodiment illustrated in FIG. 5 includes the power supply source 10, the relay box (R/B) 20, a plurality of power distribution devices 51, 52, 53 and 54, and a detector 60 according to the second embodiment. The power supply system 2 may be mounted on, for example, a vehicle, and is configured to be able to supply power of the power supply source 10 to a plurality of in-vehicle devices 41, 42, 43, and 44 which are electric loads.

The power supply system 2 according to the second embodiment is the same as the power supply system 1 according to the first embodiment except that the former has a plurality of power distribution devices 51, 52, 53, and 54, and the detector 60. Hereinafter, the second embodiment will be described focusing on these different configurations, and parts of the configuration having the same reference numerals will not be described.

A power distribution device A_51 is one aspect of the power supply box capable of distributing the first portion of power output from the relay box 20 for a plurality of loads, and of switching a power distribution status. The power distribution device A_51 includes a switch SW11, a switch SW12, and a control unit C11 as illustrated in the detailed view of FIG. 6.

The switch SW11 is inserted between an input terminal to which the relay box 20 is connected and an output terminal to which a power distribution device C_53 is connected. The switch SW12 is inserted between the input terminal and a switch SW13 (described later) of a power distribution device B_52. The in-vehicle device a_41 is connected to the input terminal. The control unit C11 can receive a collision signal output from the detector 60 described later. Then, the control unit C11 controls conduction and cutoff of the switches SW11 and SW12 based on the received collision signal.

Figure 6:
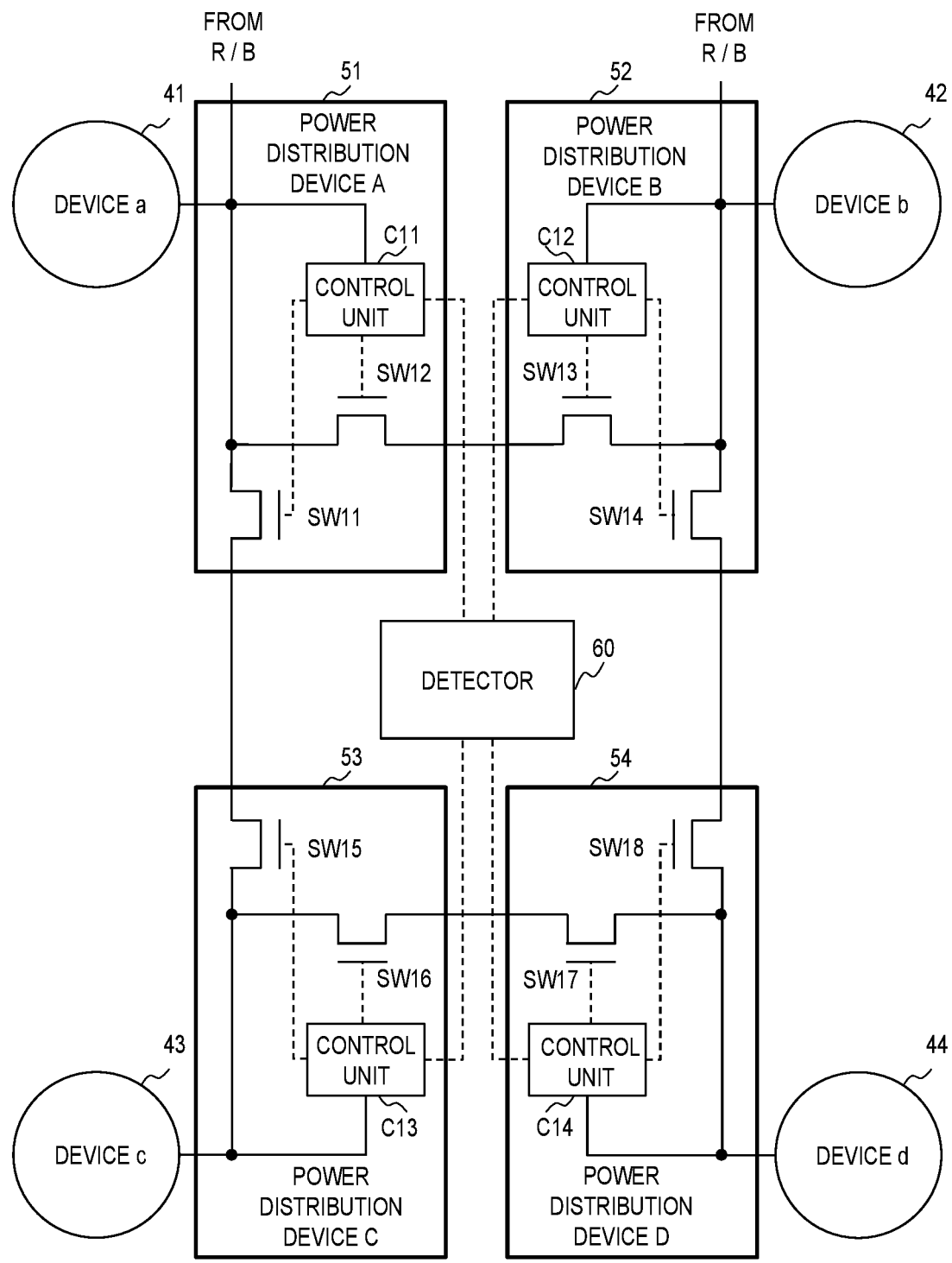
FIG. 6 is a detailed view of the power distribution device according to the second embodiment.

In the example of FIG. 6, the power distribution device A_51 distributes the first portion of power output from the relay box 20 for a plurality of loads, supplies a portion of the first portion of power to the in-vehicle device a_41, and supplies a portion of the first portion of power to the control unit C11. Then, in a case where the switch SW11 is in a conductive state by the control of the control unit C11, the remaining power is output to the power distribution device C_53 via the switch SW11. The control of the control unit C11 will be described later.

The power distribution device B_52 is one aspect of the power supply box capable of distributing the second portion of power output from the relay box 20 for a plurality of loads, and of switching a power distribution status. The power distribution device B_52 includes a switch SW13, a switch SW14, and a control unit C12 as illustrated in the detailed view of FIG. 6.

The switch SW14 is inserted between the input terminal to which the relay box 20 is connected and the output terminal to which a power distribution device D_54 is connected. The switch SW13 is inserted between the input terminal and the switch SW12 of the power distribution device A_51. The in-vehicle device b_42 is connected to the input terminal. The control unit C12 can receive the collision signal output from the detector 60 described later. Then, the control unit C12 controls conduction and cutoff of the switches SW13 and SW14 based on the received collision signal.

In the example of FIG. 6, the power distribution device B_52 distributes the second portion of power output from the relay box 20 for a plurality of loads, supplies a portion of the second portion of power to the in-vehicle device b_42, and supplies a portion of the second portion of power to the control unit C12. Then, in a case where the switch SW14 is in a conductive state by the control of the control unit C12, the remaining power is output to the power distribution device D_54 via the switch SW14. Since the control of the control unit C12 is the same as that of the control unit C11, description will be omitted except for the description of the control unit C11.

The power distribution device C_53 is one aspect of the power supply box capable of distributing the power output from the power distribution device A_51 for a plurality of loads, and of switching a power distribution status. The power distribution device C_53 includes a switch SW15, a switch SW16, and a control unit C13 as illustrated in the detailed view of FIG. 6.

The switch SW15 is inserted between the input terminal to which the power distribution device A_51 is connected and the output terminal to which the in-vehicle device c_43 is connected. The switch SW16 is inserted between the output terminal and a switch SW17 (described later) of the power distribution device D_54. The control unit C13 can receive the collision signal output from the detector 60 described later. Then, the control unit C13 controls conduction and cutoff of the switches SW15 and SW16 based on the received collision signal.

In the example of FIG. 6, the power distribution device C_53 distributes the power output from the power distribution device A_51 for a plurality of loads, and supplies a portion of the power to the in-vehicle device c_43 via the switch SW15 in a case where the switch SW15 is in a conductive state by the control of the control unit C13. The remaining power is supplied to the control unit C13 as a power source.

The power distribution device D_54 is one aspect of the power supply box capable of distributing the power output from the power distribution device B_52 for a plurality of loads, and of switching a power distribution status. The power distribution device D_54 includes a switch SW17, a switch SW18, and a control unit C14 as illustrated in the detailed view of FIG. 6.

The switch SW18 is inserted between the input terminal to which the power distribution device B_52 is connected and the output terminal to which the in-vehicle device d_44 is connected. The switch SW17 is inserted between the output terminal and the switch SW16 of the power distribution device C_53. The control unit C14 can receive the collision signal output from the detector 60 described later. Then, the control unit C14 controls conduction and cutoff of the switches SW17 and SW18 based on the received collision signal.

In the example of FIG. 6, the power distribution device D_54 distributes the power output from the power distribution device B_52 for a plurality of loads, and supplies a portion of the power to the in-vehicle device d_44 via the switch SW18 in a case where the switch SW18 is in a conductive state by the control of the control unit C14. The remaining power is supplied to the control unit C14 as a power source.

Although FIGS. 5 and 6 show an example in which four power distribution devices 51, 52, 53, and 54 are connected in a round structure, the number of, and connection structure of, the power distribution devices are not limited thereto. Basically, there is no limitation as long as a configuration in which the power distribution devices are connected to each other via respective switches is adopted. Further, the in-vehicle devices 41, 42, 43, and 44 connected to the power distribution devices 31, 32, 33, and 34 are not limited to the devices shown in FIGS. 5 and 6. Further, the switches SW11, SW12, SW13, SW14, SW15, SW16, SW17 and SW18 are exemplified by switches using semiconductor elements, but may be switches of mechanical relays. Further, the control units C11, C12, C13 and C14 may be configured as ECUs respectively including a processor, a memory, and an input/output interface. Further, a flat wiring member (bus bar) through which a large current can flow can be used for power lines connecting the power distribution devices.

The detector 60 is a device capable of determining that the vehicle has been involved in a collision and of specifying a location of the vehicle where the collision has occurred with certainty. For example, the detector 60 may include an airbag ECU, a collision sensor and an acceleration sensor. The detector 60 specifies a power supply wiring path that is likely to be damaged by the collision of the vehicle based on whether an inflator is operated or not, a detected position of the sensor, and a magnitude and time of an input acceleration, and outputs the collision signal indicating the specified power supply wiring path to the power distribution devices 51, 52, 53, and 54.

Control

Figure 7:
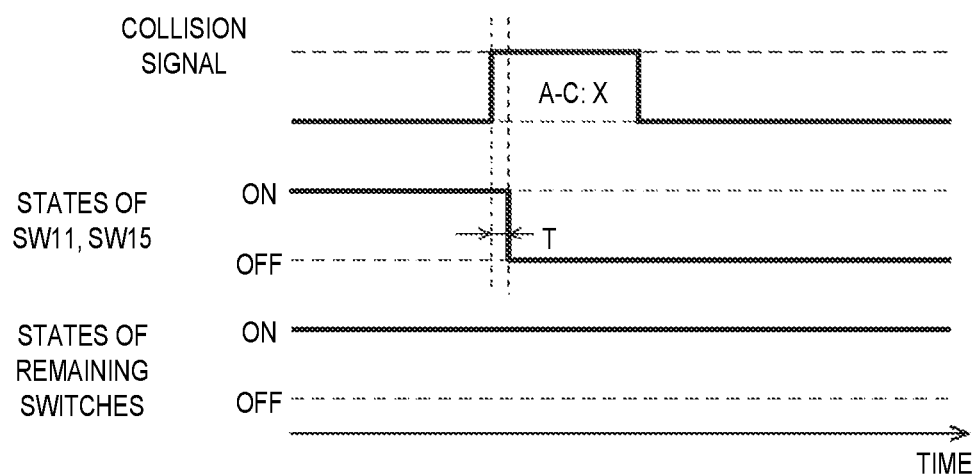
FIG. 7 is an exemplified timing chart of switching control executed by the power distribution device according to the second embodiment.

Next, the control executed by the power distribution device according to the second embodiment of the present disclosure will be described with reference to FIG. 7 FIG. 7 is a timing chart illustrating the switching control in a case where the collision signal is output from the detector 60 to each power distribution device, wherein the collision signal includes information indicating that the power supply wiring path between the power distribution device A_51 and the power distribution device C_53 is likely to be damaged (A-C: X). In this example, it is assumed that all the switches are normally in the conductive state.

The power distribution device A_51 that has received the collision signal cuts off the switch SW11 inserted between the power distribution device A_51 and the power distribution device C_53 (SW11: OFF). Further, the power distribution device C_53 that has received the collision signal cuts off the switch SW15 inserted between the power distribution device A_51 and the power distribution device C_53 (SW15: OFF). With this switching control, the output terminal of the power distribution device A_51 and the input terminal of the power distribution device C_53 are disconnected.

Further, in order to avoid interruption of the power supply wiring due to an erroneous determination of the detector 60, for example, in a case where the collision signal in the form of a pulse is output due to the influence of noise, the collision signal is received from the detector 60, and then the switches SW11 and SW15 may be cut off after waiting for a predetermined time T as shown in FIG. 7. In this case, the predetermined time T is required to be set so as to not allow the occurrence of a specific event such as smoking even when the detector 60 makes an accurate determination, not an erroneous determination.

It is assumed that all the switches are in the conductive state as a normal state in which the collision signal is not received. However, the switches SW16 and SW17 connecting the power distribution device C_53 and the power distribution device D_54 may be in the cutoff state. In this case, after the control units C13 and C14 receive the collision signal indicating the power supply wiring path between the power distribution device A_51 and the power distribution device C_53, or alternatively, the power supply wiring path between the power distribution device B_52 and the power distribution device D_54, from the detector 60, the switches SW16 and SW17 may be switched to the conductive state, respectively.

Action & Effect

As described above, according to the power distribution device according to the second embodiment, when it is determined that it is likely that the power supply wiring is damaged due to a collision of the vehicle or the like, the power supply wiring is cut off before and after a point where the collision has occurred so as to be disconnected. Thus, when abnormalities such as ground fault occur due to the impact of the collision, it is possible to avoid a situation where the power supply fails.

Application Example

Figure 8:
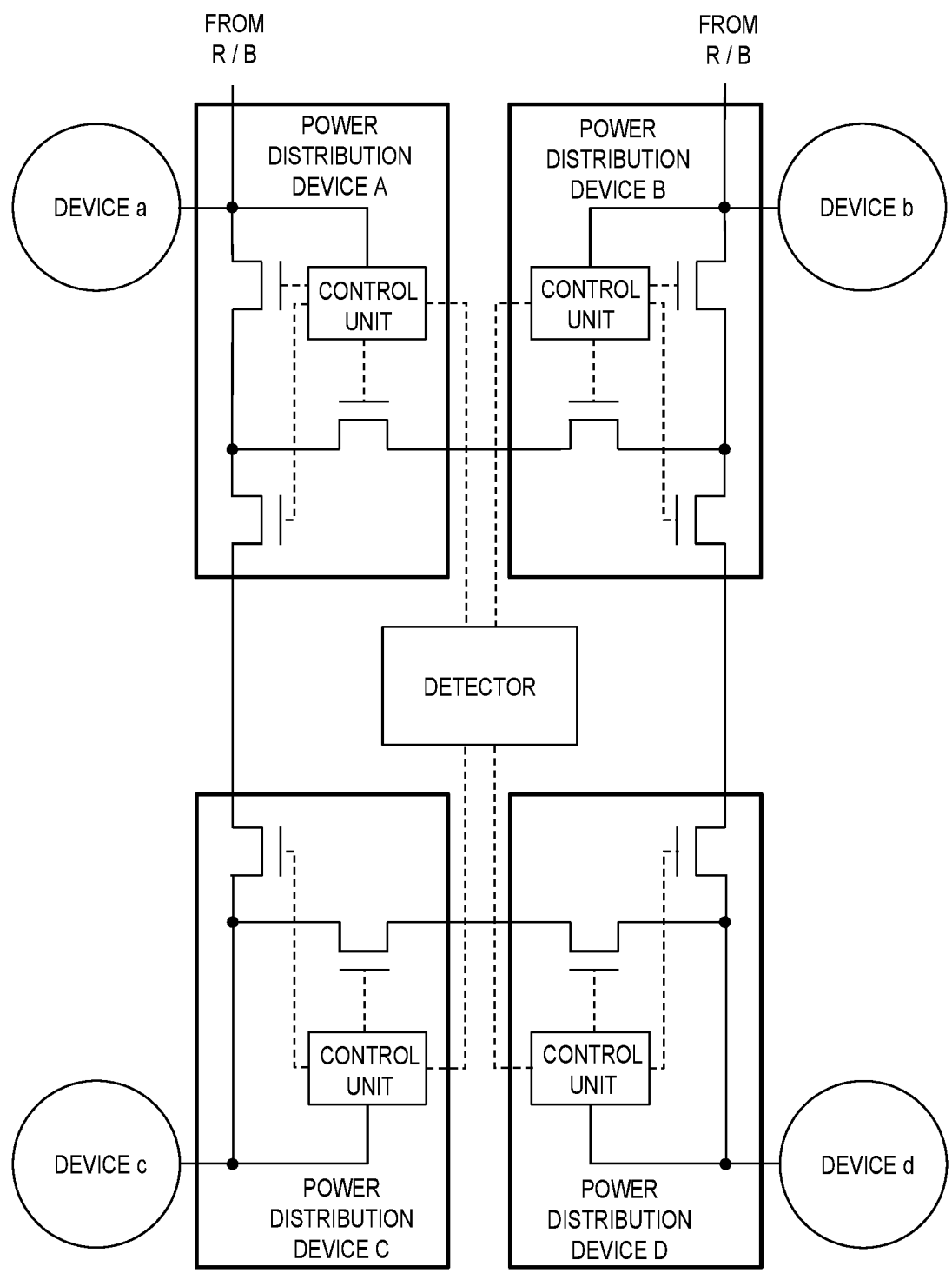
FIG. 8 is a schematic configuration diagram of a power supply system including a power distribution device according to an application example.

By adopting a configuration of the application example shown in FIG. 8, it is possible to control both the switching control for switching to the power supply path to the downstream device when the output voltage to the downstream device is unstable, as described in the first embodiment, and the switching control for disconnecting a point where the power supply wiring is likely to be damaged due to a collision of the vehicle, as described in the second embodiment.

The present disclosure relates to not only the power supply system including the power distribution device, but also to a vehicle equipped with the power supply system including the power distribution device.

The power distribution device of the present disclosure can be used for vehicles such as automobiles.

What is claimed is:

1. A power distribution device that is directly connected to a power supply source mounted on a vehicle or indirectly connected to the power supply source via a first device and distributes power of the power supply source to a second device, the power distribution device comprising:
   a first switch configured to connect the power supply source or the first device to the second device;
   a second switch configured to connect the second device to a third device configured to distribute predetermined power; and
   a control unit configured to control conduction and cutoff of the first switch and the second switch based on an output voltage of the power distribution device, wherein
   the control unit is configured to switch, when an input voltage of the second device temporarily drops to a control start voltage, the first switch to a cutoff state and the second switch to a conductive state, and control the third device such that the third device supplies power to the second device.

2. The power distribution device according to claim 1, wherein the input voltage of the second device is obtained based on the output voltage and an output current of the power distribution device, and a wiring resistance from the power distribution device to the second device.

3. The power distribution device according to claim 1, wherein the control unit is configured to switch, when the input voltage of the second device becomes equal to or lower than the control start voltage and then an input voltage of the power distribution device becomes equal to or higher than a predetermined control end voltage, the first switch to the conductive state and the second switch to the cutoff state.

4. The power distribution device according to claim 3, wherein the control end voltage is set to a value such that the input voltage of the second device does not fall below the control start voltage immediately after the control unit determines that the input voltage of the second device has become equal to or lower than the control end voltage and switches the first switch to the conductive state and the second switch to the cutoff state.

5. The power distribution device according to claim 1, wherein the control unit is configured to switch, when the input voltage of the second device temporarily drops to the control start voltage, the second switch to the conductive state, and then the first switch to the cutoff state after a predetermined time has elapsed.

6. The power distribution device according to claim 3, wherein the control unit is configured to switch, when the input voltage of the second device becomes equal to or lower than the control start voltage and then the input voltage of the power distribution device becomes equal to or higher than the control end voltage, the first switch to the conductive state, and then the second switch to the cutoff state after a predetermined time has elapsed.

7. A power distribution device that is directly connected to a power supply source mounted on a vehicle or indirectly connected to the power supply source via a first device, and distributes power of the power supply source to a second device, the power distribution device comprising:
 a first switch configured to connect the power supply source or the first device to the second device;
 a second switch configured to connect the second device to a third device configured to distribute predetermined power; and
 a control unit configured to control conduction and cutoff of the first switch and the second switch based on a collision signal indicating a wiring path likely to be damaged by a collision of a vehicle, the collision signal being received from a predetermined detector, wherein
 the control unit is configured to switch the first switch to a cutoff state and the second switch to a conductive state when receiving the collision signal indicating a wiring path from the power distribution device to the second device.

8. The power distribution device according to claim 7, wherein the predetermined detector is configured to specify the wiring path likely to be damaged by the collision of the vehicle based on information on a detection state of a sensor, an operation state of an airbag, an input acceleration and a time, which is obtained from the vehicle.

* * * * *